US 9,196,752 B2

(12) United States Patent
Baskaran et al.

(10) Patent No.: US 9,196,752 B2
(45) Date of Patent: Nov. 24, 2015

(54) BACKSIDE BULK SILICON MEMS

(75) Inventors: Rajashree Baskaran, Seattle, WA (US);
Christopher M. Pelto, Aloha, OR (US)

(73) Assignee: INTEL CORPORATION, Santa Clara, CA (US)

( * ) Notice: Subject to any disclaimer, the term of this patent is extended or adjusted under 35 U.S.C. 154(b) by 56 days.

(21) Appl. No.: 13/976,086

(22) PCT Filed: Dec. 28, 2011

(86) PCT No.: PCT/US2011/067523
§ 371 (c)(1),
(2), (4) Date: Jun. 26, 2013

(87) PCT Pub. No.: WO2013/100951
PCT Pub. Date: Jul. 4, 2013

(65) Prior Publication Data
US 2014/0117470 A1    May 1, 2014

(51) Int. Cl.
| H01L 29/84 | (2006.01) |
| B81C 1/00 | (2006.01) |
| B81B 7/02 | (2006.01) |
| H01L 23/00 | (2006.01) |
| H01L 21/768 | (2006.01) |

(52) U.S. Cl.
CPC . *H01L 29/84* (2013.01); *B81B 7/02* (2013.01); *B81C 1/00246* (2013.01); *B81C 2203/0771* (2013.01); *H01L 21/76898* (2013.01); *H01L 24/13* (2013.01); *H01L 24/16* (2013.01); *H01L 2224/0401* (2013.01); *H01L 2224/05025* (2013.01); *H01L 2224/13025* (2013.01); *H01L 2224/13124* (2013.01); *H01L 2224/13147* (2013.01); *H01L 2224/13184* (2013.01); *H01L 2224/16145* (2013.01); *H01L 2224/81193* (2013.01); *H01L 2924/1306* (2013.01); *H01L 2924/13091* (2013.01); *H01L 2924/1461* (2013.01)

(58) Field of Classification Search
None
See application file for complete search history.

(56) References Cited

U.S. PATENT DOCUMENTS

| 2008/0128901 A1 | 6/2008 | Zurcher et al. |
| 2011/0127620 A1 | 6/2011 | Wang et al. |
| 2011/0186990 A1 | 8/2011 | Mawatari et al. |

(Continued)

FOREIGN PATENT DOCUMENTS

WO    2013/100951 A1    7/2013

OTHER PUBLICATIONS

International Search Report and Written Opinion received for PCT Patent Application No. PCT/US2011/067523, mailed on Jul. 18, 2012, 9 pages.

(Continued)

*Primary Examiner* — Sonya D McCall Shepard
(74) *Attorney, Agent, or Firm* — Finch & Maloney PLLC

(57) ABSTRACT

An integrated circuit device that comprises a single semiconductor substrate, a device layer formed on a frontside of the single semiconductor substrate, a redistribution layer formed on a backside of the single semiconductor substrate, a through silicon via (TSV) formed within the single semiconductor substrate that is electrically coupled to the device layer and to the redistribution layer, a logic-memory interface (LMI) formed on a backside of the single semiconductor substrate that is electrically coupled to the redistribution layer, and a MEMS device formed on the backside of the single semiconductor substrate that is electrically coupled to the redistribution layer.

25 Claims, 19 Drawing Sheets

(56) References Cited

U.S. PATENT DOCUMENTS

| | | |
|---|---|---|
| 2011/0291167 A1 | 12/2011 | Shimooka et al. |
| 2013/0043547 A1* | 2/2013 | Chu et al. .................. 257/415 |
| 2013/0168740 A1* | 7/2013 | Chen .......................... 257/254 |

OTHER PUBLICATIONS

International Preliminary Report on Patentability and Written Opinion received for PCT Patent Application No. PCT/US2011/067523, mailed on Jul. 10, 2014, 6 pages.

* cited by examiner

BACKSIDE BULK SILICON MEMS

BACKGROUND

As is well known in the art, an integrated circuit (IC) die, also referred to as an chip, typically contain an active device layer formed on a hulk silicon substrate and a metallization layer formed on the active device layer. The active device layer contains the active circuitry formed using a large number of transistors. The active circuitry may be, for example, logic circuitry for an IC chip that is used as a processor. The metallization layer is formed using several layers of insulated metal lines that interconnect the transistors in the active device layer. These metal lines are generally referred to as metal interconnects. A passivating layer is generally formed over the metal interconnects and copper bumps are formed atop the passivation layer that couple the metal interconnects to external devices. The copper bumps are often controlled-collapse chip connections (C4 bumps).

The backside surface of the integrated circuit die, opposite the C4 bumps, is generally not used for any functional purpose. In some embodiments the backside surface may be polished using a chemical mechanical polishing process to remove a portion of the bulk silicon substrate material and thereby reduce the thickness of the IC die. Aside from that, the backside of the IC die generally remains unused.

DETAILED DESCRIPTION

Described herein are systems and methods of forming backside devices on a conventional IC chip formed on a bulk silicon substrate. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
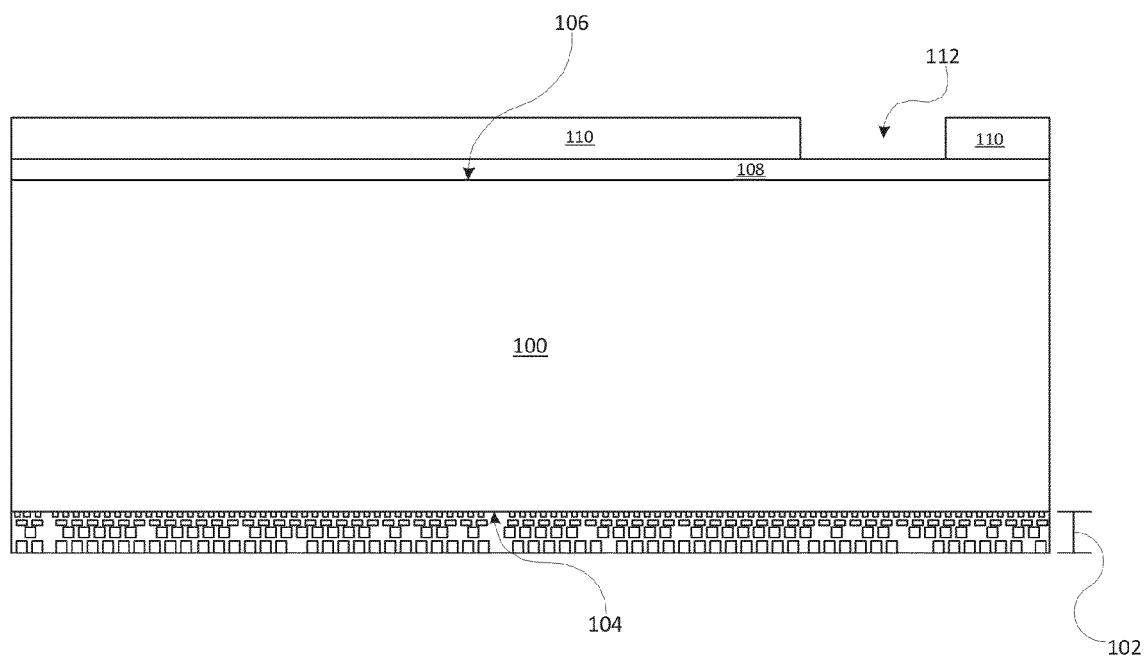
FIGS. 1-16 illustrate the formation of a TSV and a backside MEMS device on an integrated circuit die.

Implementations of the invention may be formed or carried out on a substrate, such as a semiconductor substrate 100 shown in FIG. 1. In one implementation, the semiconductor substrate 100 may be a crystalline substrate formed using a bulk silicon or a silicon-on-insulator substructure. In other implementations, the semiconductor substrate 100 may be formed using alternate materials, which may or may not be combined with silicon, that include but are not limited to germanium, indium antimonide, lead telluride, indium arsenide, indium phosphide, gallium arsenide, or gallium antimonide. Further materials classified as group III-V or group IV materials may also be used to form the substrate. Although a few examples of materials from which the substrate may be formed are described here, any material that may serve as a foundation upon which a semiconductor device may be built falls within the spirit and scope of the present invention.

It should be noted that the semiconductor substrate 100 is initially part of a semiconductor wafer that is at some point singulated into a separate integrated circuit die. The processes included herein may be performed when the semiconductor substrate 100 is stilt part of the semiconductor wafer or they may be performed after the wafer has been diced and the semiconductor substrate 100 is singulated into a separate integrated circuit die. In either event, the integrated circuit die may then be coupled to other substrates, such as a memory module substrate, as a system-on-a-chip (SOC) device.

As shown in FIG. 1, a device layer 102 is formed on a frontside 104 of the semiconductor substrate 100. The device layer 102 consists of a plurality of transistors, such as metal-oxide-semiconductor field-effect transistors (MOSFET or simply MOS transistors), that are fabricated directly on the substrate. In various implementations of the invention, the MOS transistors may be planar transistors, nonplanar transistors, or a combination of both. Nonplanar transistors include double-gate transistors, trigate transistors, and wrap-around gate transistors, some of which are often referred to as Fin-FET transistors.

Each MOS transistor includes a gate stack formed of at least two layers, a gate dielectric layer and a gate electrode layer. The gate dielectric layer may be formed of a material such as silicon dioxide ($SiO_2$) or a high-k material. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, al Wm oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of two or more metal layers, where at least one metal layer is a workfunction metal layer and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In implementations of the invention, a pair of spacers brackets the gate stack. The spacers may be formed from a material such as silicon nitride, silicon oxide, silicon carbide, silicon nitride doped with carbon, and silicon oxynitride. Processes for forming spacers are well known in the art and generally include deposition and etching process steps.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. The ion implantation process is typically followed by an annealing process that activates the dopants and causes them to diffuse further into the substrate. In the latter process, the substrate may first be etched to form recesses at the locations of the source and drain regions. An epitaxial deposition process may then be carried out to fill the recesses with a silicon alloy such as silicon germanium or silicon carbide, thereby forming the source and drain regions. In some implementations the epitaxially deposited silicon alloy may be doped in situ with dopants such as boron, arsenic, or phosphorous. In further implementations, alternate materials may be deposited into the recesses to form the source and drain regions, such as germanium or a group III-V material or alloy.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or other voids to further reduce their dielectric constant.

Device layer 102 further comprises metallization layers that electrically interconnect the various transistors in the device layer 102. There may be several layers of metallization, with each layer typically including metal interconnects, metal vias, and insulating interlayer dielectric (ILD) materials. The metal interconnects may consist of a metal line formed from materials such as copper, copper alloys, silver, carbon nanotubes, as well as other electrically conductive materials. The metal interconnects may also include barrier and/or adhesion layers that are formed between the metal lines and the surrounding ILD. The barrier and adhesion layers are typically formed using materials such as tantalum, titanium, tantalum nitride, and titanium nitride.

Implementations of the invention provide a process flow and resulting structure that incorporates at least one microelectromechanical system, referred to as a MEMS device, onto the backside of a semiconductor substrate that has a device layer 102 on its frontside. MEMS technology generally refers to very small or miniaturized mechanical and electro-mechanical devices driven by electricity. MEMS devices are made using the techniques of microfabrication. MEMS may also refer to micromachines or microsystems technology. MEMS devices may include several components that interact with the outside and can vary from relatively simple structures having no moving elements to extremely complex electromechanical systems with multiple moving elements under the control of integrated microelectronics. Types of MEMS devices include, but are not limited to, sensors, microsensors, resonators, actuators, microactuators, microelectronics, and transducers. FIGS. 1 to 16 illustrate the process flow one implementation of the invention in detail.

Starting with FIG. 1, the process flow may begin with the formation of a through-silicon via (TSV) that will interconnect the device layer 102 to another device, such as a memory module substrate (shown in FIGS. 17A/B), or to a MEMS device that is subsequently formed on a backside 106 of the semiconductor substrate 100. Formation of the TSV after fabrication of the device layer 102 is complete is known as a "via last". It should be noted that in alternate implementations, the TSV may be formed using what is known as a "via middle" (i.e., the TSV is formed after fabrication of the device layer 102 is started but before fabrication of the device layer 102 is complete or using what is known as a "via first" (i.e., the TSV is formed before fabrication of the device layer 102 is started). The process flows of the invention described herein are compatible with any of the via first, via middle, or via last processes.

Here, the semiconductor substrate 100 is shown having a device layer 102 on its frontside 104. The backside 106 of the semiconductor substrate 100 is also shown. The semiconductor substrate 100 will herein be referred to as the substrate 100. Although the substrate 100 is shown as including a device layer 102, in alternate implementations, there may be no device layer 102 present. An interposer substrate is an example of such a substrate 100 where a device layer 102 is unnecessary.

A hard mask layer 108 is deposited onto the backside 106 of the substrate 100. The hard mask layer 108 may be formed using a nitride or oxide based material, such as silicon nitride, silicon oxide, or silicon oxynitride. In alternate implementations of the invention, alternate hard mask materials. Deposition methods for a hard mask layer are known in the art. Next, a photoresist layer 110 is deposited and patterned to produce an opening 112 in the photoresist layer 110 that defines the TSV. Methods of depositing and patterning photoresist layers are also known in the art.

Figure 2:
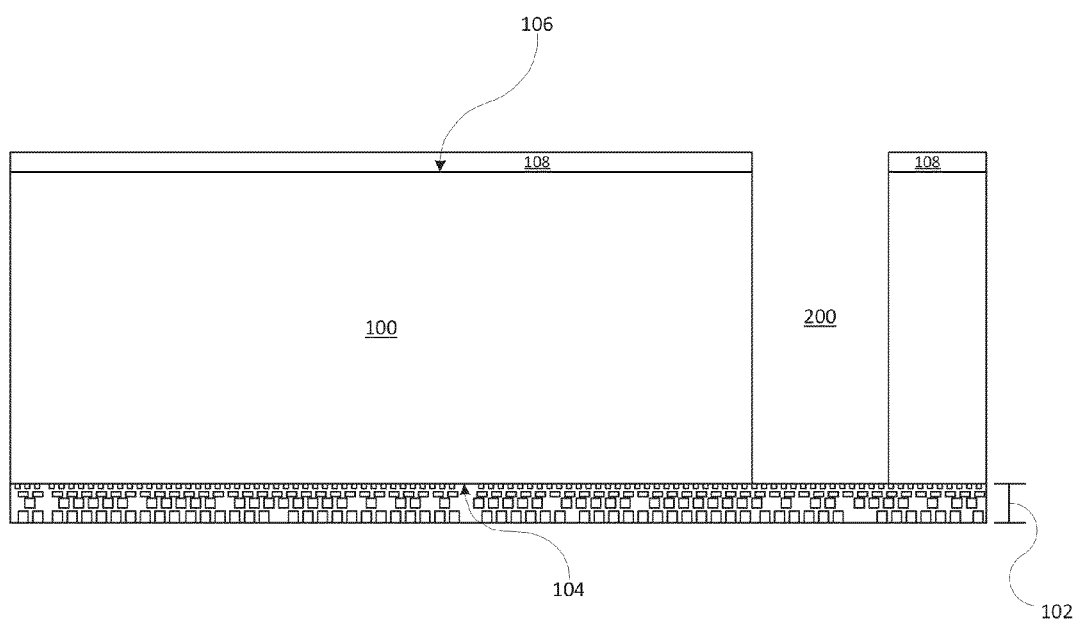

Moving to FIG. 2, an anisotropic etching process is used to form a via opening 200 in the substrate 100. The anisotropic etching process drills down through the opening 112 in the photoresist layer 110 to reach the device layer 102. The etching process may be a wet etch process or a dry etch process. In one implementation of the invention, an anisotropic dry etch process using an $SF_6$ etch chemistry is used to form the via opening 200. In another implementation, the $SF_6$ dry etch may be accompanied by a polymer passivation step. One such $SF_6$ etch+ polymer passivation process is known as the "Bosch" etch and uses a $CHF_3$ passivation polymer. After the via opening 200 is formed, the photoresist layer 110 is removed using known methods.

Figure 3:
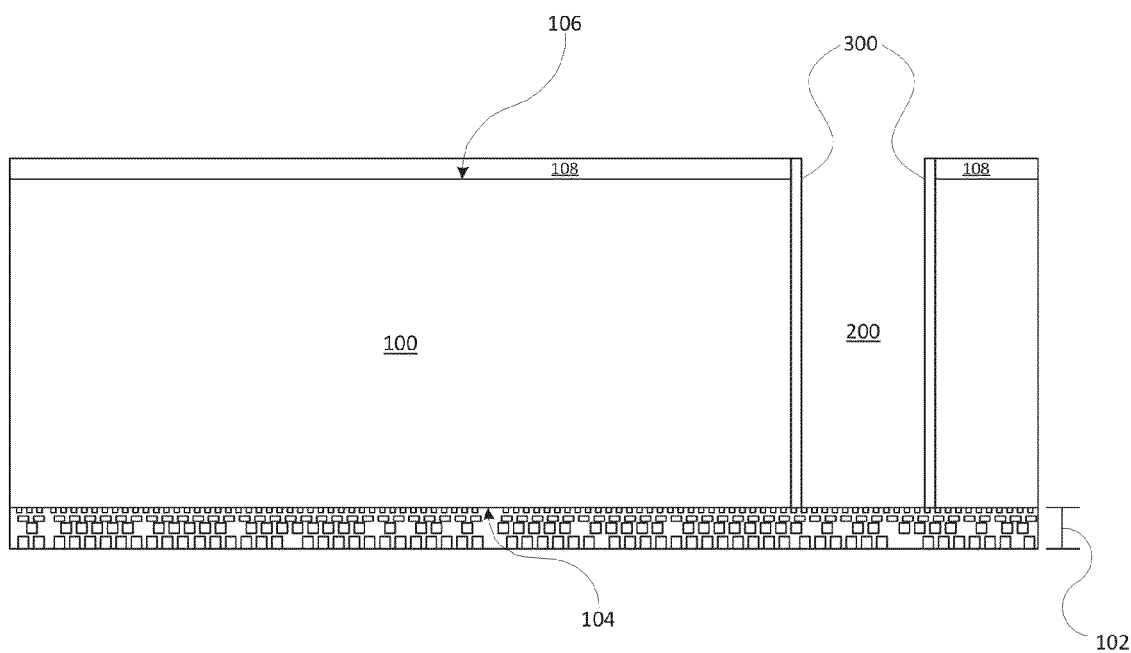

FIG. 3 illustrates the formation of a sidewall liner 300 for the via opening 200. In implementations of the invention, the sidewall liner 300 may consist of an oxide, such as silicon dioxide, that is deposited using a chemical vapor deposition process, such as CVD, atomic layer deposition (ALD). This provides a conformal oxide layer. Alternately, a physical vapor deposition (PVD) process such as sputtering may be used. The sidewall liner 300 is initially deposited as a conformal layer of the liner material that blankets the entire structure. This blanket layer is then etched using an anisotropic etch process to remove the liner material that is atop the hard mask layer 108 and along the bottom surface of the via opening 200. Removing the liner 300 from the bottom of the via opening 200 enables the subsequently formed TSV to electrically contact the device layer 102. The etching process may be a wet or dry etching process, for instance, a dry fluorinebased anisotropic etch chemistry may be used. The anisotropic etching process yields the sidewall liner 300 shown in FIG. 3.

Figure 4:
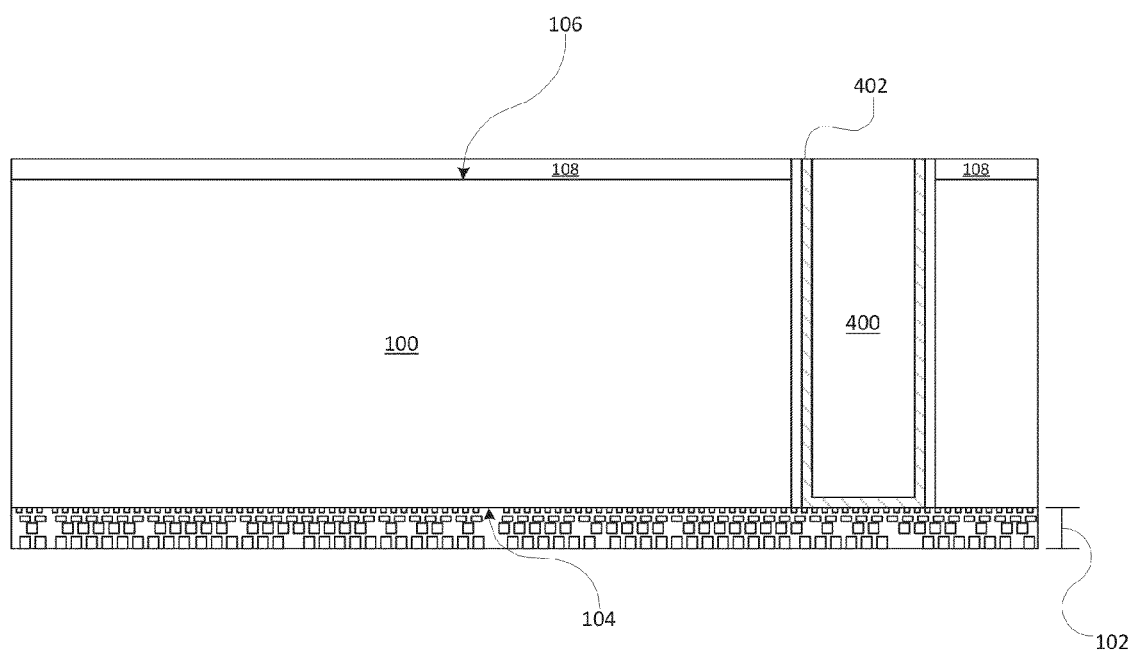

FIG. 4 illustrates the formation of a TSV 400. The TSV 400 may be formed by initially depositing a seed layer, such as copper seed layer 402, and then filling the via opening 200 using an electroplating or electroless plating process to deposit a metal such as copper, a copper alloy, aluminum, an aluminum alloy, or alternate metal, into the via opening 200 to fill it and form the TSV 400. A chemical mechanical polishing process (CMP) is then performed to remove excess metal from the backside 106 of the semiconductor substrate 100. This substantially completes the formation of the TSV 400.

Figure 5:
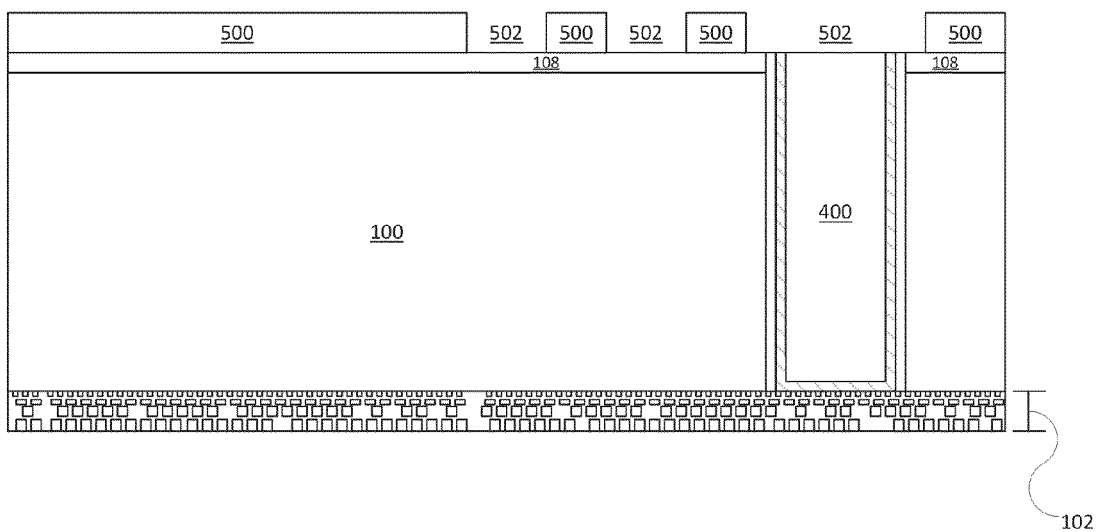
Figure 6:
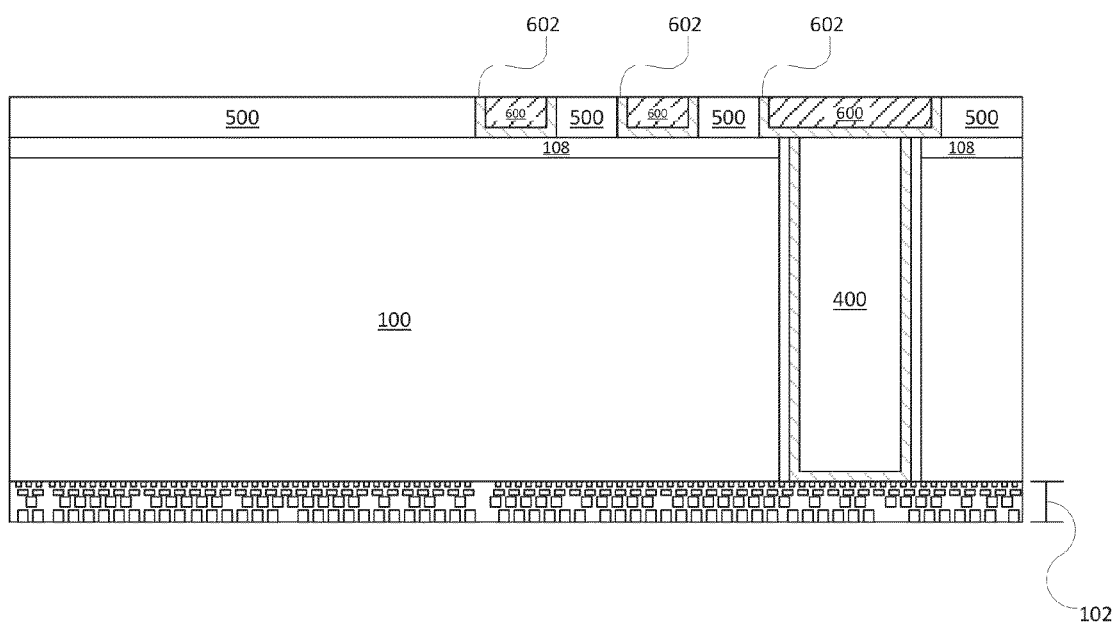

Turning to FIGS. 5 and 6, the formation of a redistribution layer is shown. Starting with FIG. 5, an interlayer dielectric (ILD) 500 is deposited and patterned to form trenches 502 in which redistribution lines are formed. The redistribution lines can route the TSV 400 to a subsequently formed electrical interface that enables communications to go off-chip to another substrate, such as a separate memory device that is later coupled to the semiconductor substrate 100. These types of electrical interfaces include, but are not limited to, controlled-collapse chip connections (C4), logic-memory interfaces (LMI), or other similar connections. This electrical interface will herein be referred to as an LMI interface, but it should be noted that this encompasses C4 and other types of connections. Alternately, the redistribution lines can route the TSV 400 to a later formed MEMS device. The ILD 500 generally consists of a material such as an oxide or a nitride, for instance, silicon dioxide, silicon nitride, or silicon oxynitride. A conventional photolithography process is used to pattern the ILD 500. Once the patterning process is complete, trenches 502 are formed in the ILD 500 that can be used to form redistribution lines.

Turning now to FIG. 6, the formation of redistribution lines 600 is shown. The redistribution lines 600 are formed using conventional processes that include the deposition of a barrier and or adhesion layer 602, followed by a metal deposition process such as electroplating or electroless plating to fill the trenches 502 in the ILD 500 and form the redistribution lines 600. Metals such as copper, a copper alloy, aluminum, an aluminum alloy, a copper-aluminum alloy, or other metals may be used to form the redistribution lines 600. A CMP process to remove any excess metal from atop the ILD 500 layer may follow the metal deposition process. FIG. 6 shows the completed redistribution lines 600, including one redistribution line 600 that is coupled to the TSV 400.

Figure 7:
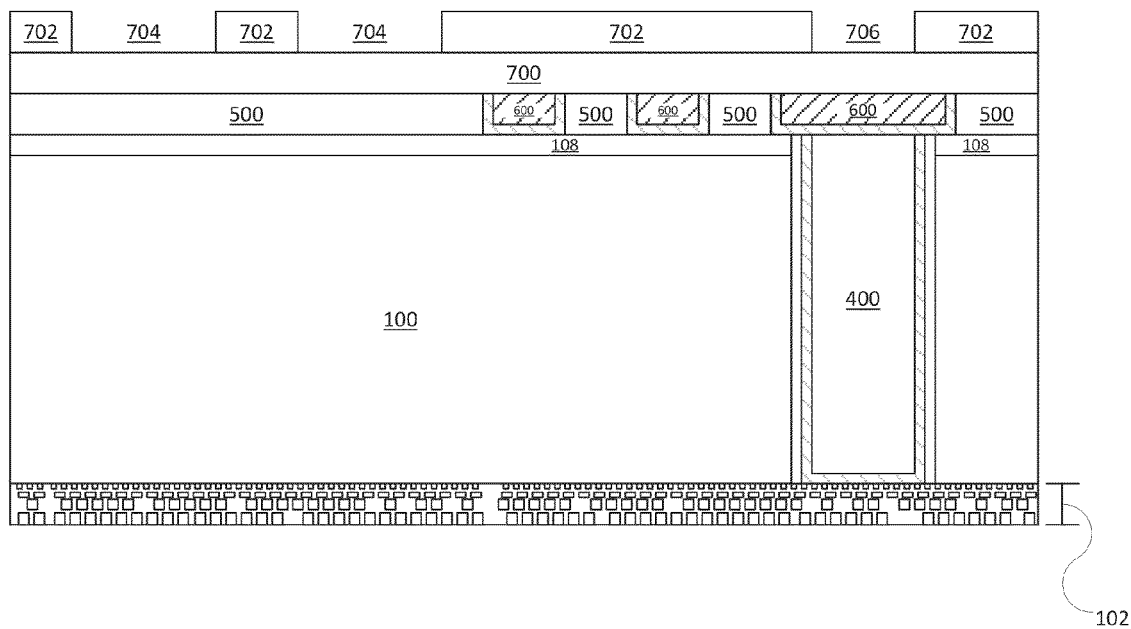

FIG. 7 illustrates the first stages of the formation of both a logic memory interface (EMI) and a MEMS device. First, a passivation layer 700 is formed over the ILD 500. The passivation layer 700 may be formed using an oxide such as silicon oxide or nitride such as silicon nitride, as well as other ILD materials including silicon oxynitride. The passivation layer 700 may be deposited using well-known deposition techniques, such as CVD, ALD, or PVD Processes. Openings or voids in the passivation layer 700 are then formed using standard photolithography patterning processes. For instance, a photoresist layer 702 may be formed and patterned atop the passivation layer 700. Openings may be patterned in the photoresist layer 702, such as voids 704 that define a subsequently formed MEMS device and void 706 that defines a subsequently formed LMI bump. Techniques for forming voids in the photoresist layer 702 are well known.

Figure 8:
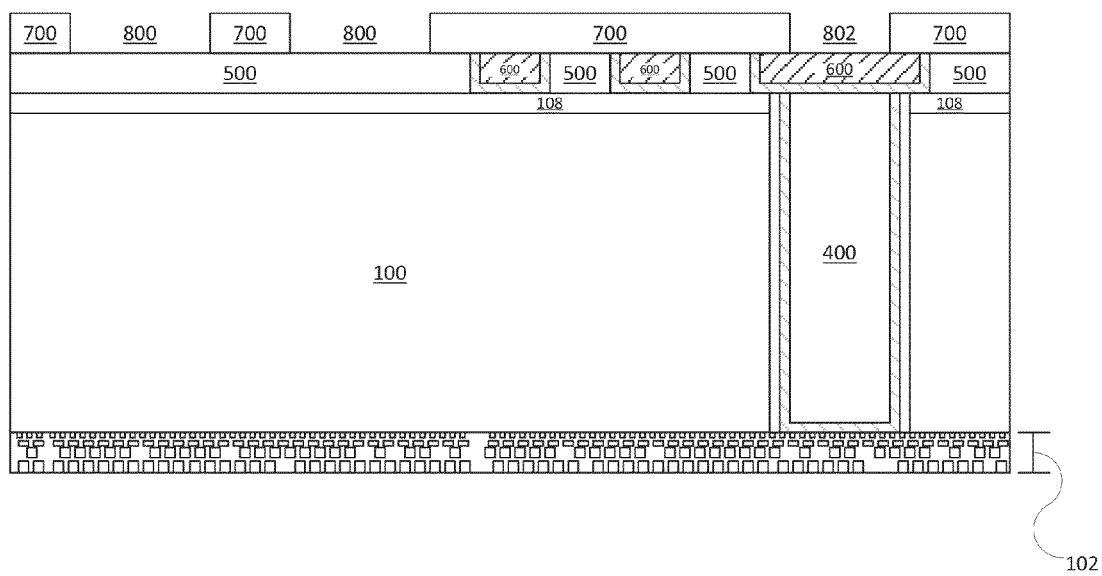

Using the photoresist layer 702 and its voids 704/706 as a mask, the passivation layer 700 is then anisotropically etched. As shown in FIG. 8, this results in MEMS trenches 800 and LMI trench 802 being formed in the passivation layer 700. FIG. 8 also illustrates removal of the photoresist layer 702. The etching process that is used is preferably designed to etch oxide but stop at the copper or other metal surface of any redistribution line 600 that is exposed. For instance, the LMI trench 802 stops at the top surface of the redistribution line 600 that sits atop the TSV 400.

Figure 9:
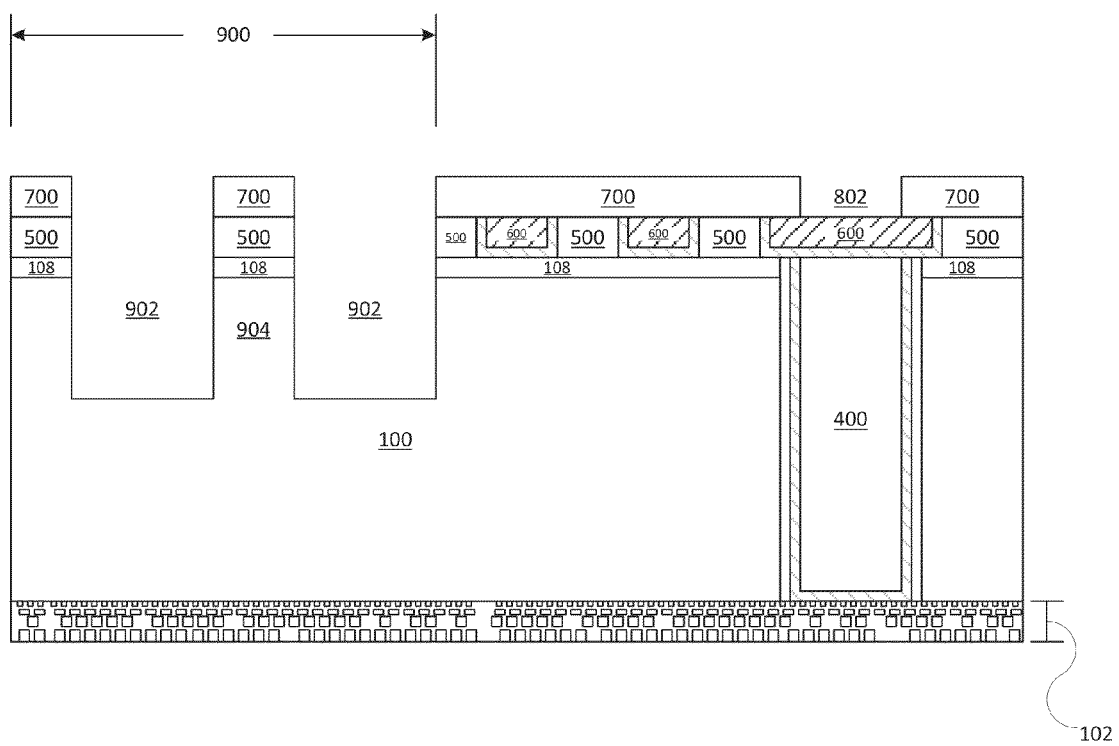

Turning now FIG. 9, although the etching of the LMI trench 802 stops at the redistribution line 600, the etching of the MEMS trenches 800 continues through the ILD 500 and into the semiconductor substrate in order to form relatively deep trenches 902 that are used to form a MEMS device 900. In one implementation, the same etch process used to form the MEMS trench 800 can be used. Alternately, a second etch process may be employed that is better suited for etching through the material of the semiconductor substrate 100. For instance, in one implementation, a dry anisotropic etch chemistry may be used to form the deep trenches 902 in the semiconductor substrate 100. This dry anisotropic etch may use an $SF_6$ etch chemistry. In alternate implementations, a dry etch chemistry using $SF_6$ plus a passivation polymer may be used. As noted above, the Bosch etch using a $CHF_3$ passivation polymer may be employed. FIG. 9 illustrates the deep MEMS trenches 902 that are used to form the MEMS device 900. The fin-like structure separating the two MEMS trenches 902 may be used for a subsequently formed cantilever 904.

In one implementation of the invention, the first etching process used to form the LMI trench 802 and the MEMS trenches 800 and the second etching process used to form the deep MEMS trenches 902 pray both be dry anisotropic etch processes and may therefore both be carried out in the same process tool.

Figure 10:
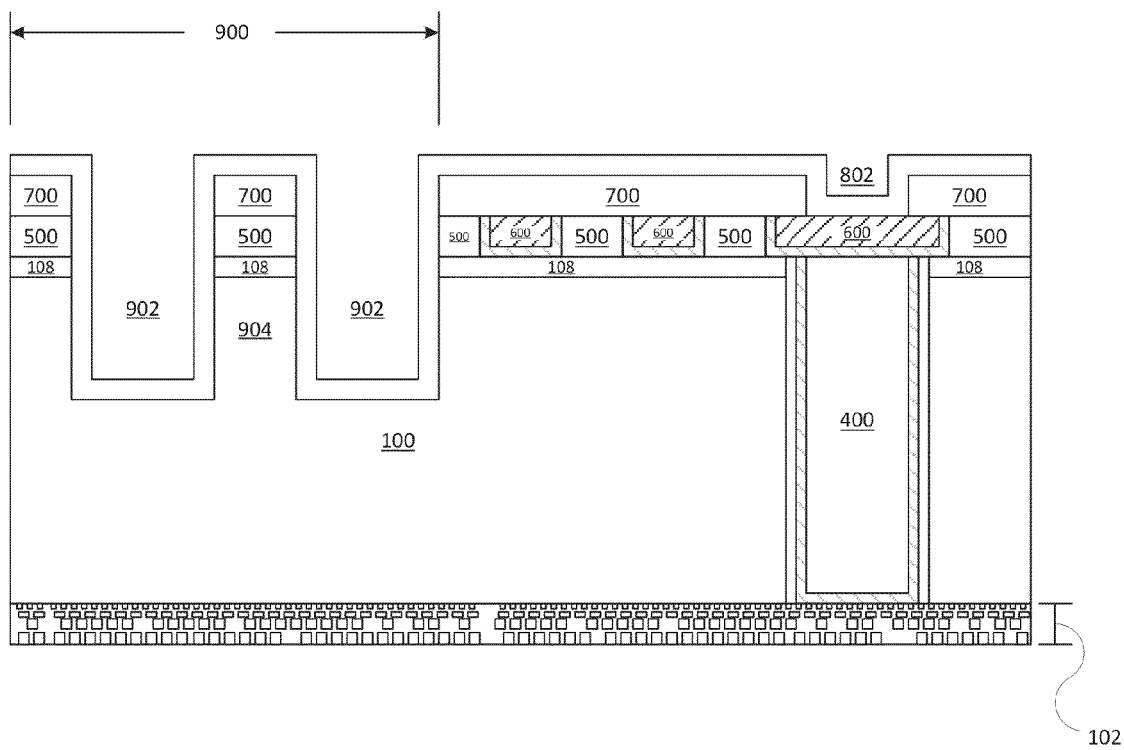

FIG. 10 illustrates the deposition of a conformal liner 1000 that is formed within the deep MEMS trenches 902, around the cantilever 904, atop the passivation layer 700, and within the LMI trench 802. The conformal liner 1000 may be formed using an oxide, such as silicon oxide, a nitride, such as silicon nitride, or another material such as silicon oxynitride. The conformal liner 1000 may be deposited using a CVD or an ALD process. This conformal liner 1000 is part of the MEMS device fabrication process.

Figure 11:
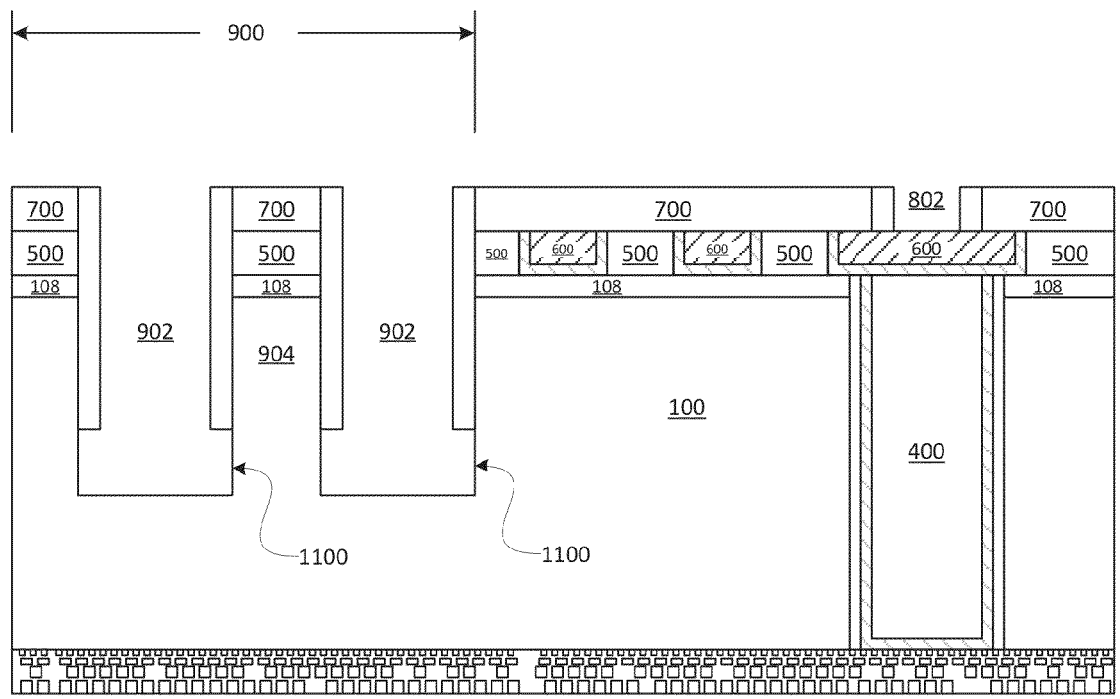

FIG. 11 illustrates what is known as a MEMS bottom punch-through etch. First, an anisotropic etch process is used to remove the conformal liner 1000 from the bottom of the deep MEMS trenches 902. This etch is typically a dry anisotropic etch process used for silicon oxide or silicon nitride. This etch removes the conformal liner 1000 from the bottom of the LMI trench 802 and the top surface of the passivation layer 700. The conformal liner 1000 remains on the sidewalk of the deep MEMS trenches 902 and the sidewalk of the LMI trench 802.

The etching of the conformal liner 1000 is followed by a silicon extension etching process. This second etching process is also typically a dry anisotropic etch process and may be carried out in the same tool as the conformal liner 100 etching process. Here, the silicon extension dry etch may utilize an $SF_6$ etch chemistry or an $SF_6$ plus passivation polymer etch chemistry. This silicon extension etch extends the deep MEMS trenches 902 beyond the bottom of the conformal liner 1000, as shown by reference numeral 1100 in FIG. 11. Extending the MEMS trenches 902 beyond the reach of the conformal liner 1000 is necessary for the subsequent MEMS release step. In an implementation of the invention, the silicon extension etch is a selective etch that has a slow etch rate on the redistribution line 600 exposed at the bottom of the LMI trench 802. This enables the silicon extension etch to work using a single mask layer approach. In contrast, if the silicon extension etch was a non-selective etch, a separate lithography step would be necessary.

Figure 12:
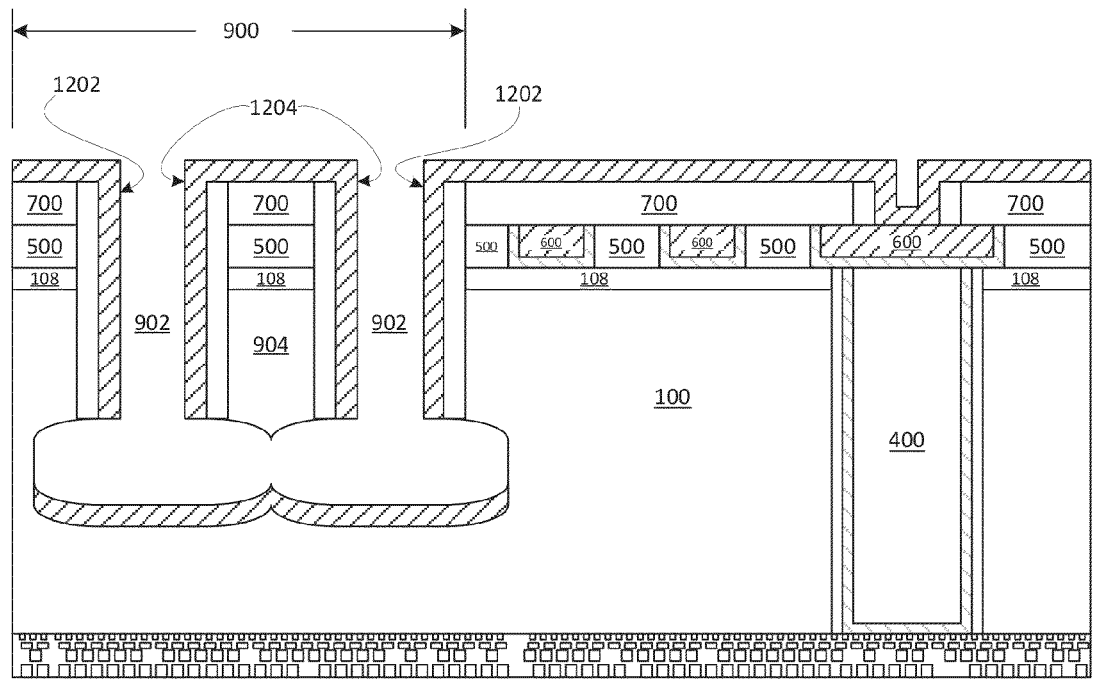
Figure 13:
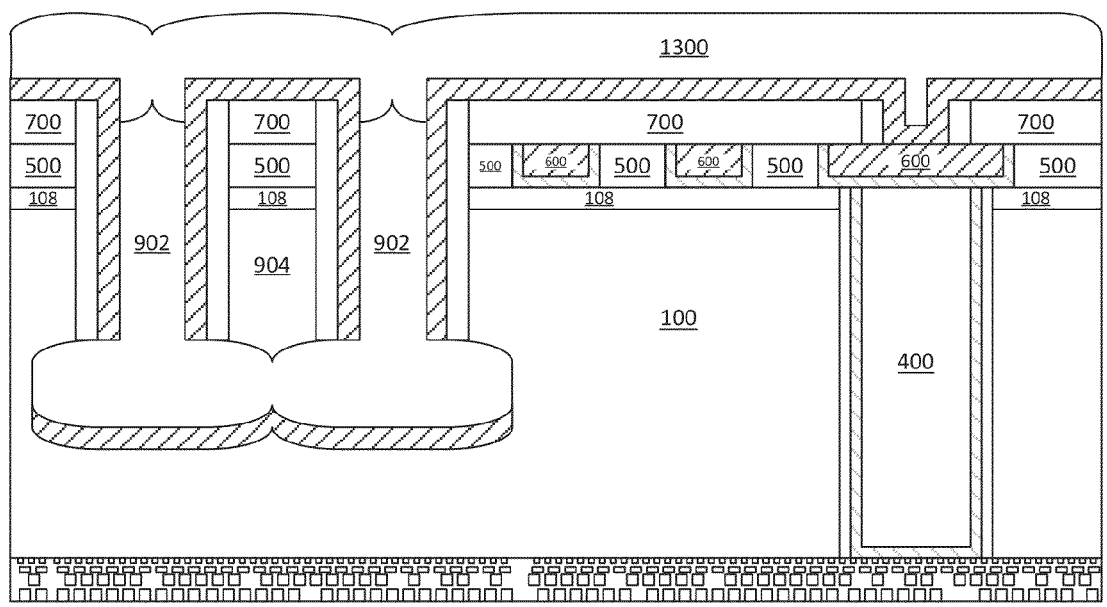

Turning now to FIG. 12, a MEMS release etching process is shown. Here, an isotropic etching process is used at the bottom of the deep MEMS trenches 902 to etch away portions of the semiconductor substrate 100. Since the etch process used here is isotropic, the etch will undercut the cantilever 904 from both sides until it is disconnected from the underlying semiconductor substrate 100. Once disconnected, the cantilever 904 has functional movement. It should be noted that one end of the cantilever 904 (not shown in the FIGS.) is anchored to the substrate 100, which enables the portion of the cantilever 904 shown in FIG. 12 to remain suspended above the semiconductor substrate 100. The isotropic etch process used in the MEMS release may be a $SF_6$-gas based etch, although other isotropic etch chemistries known in the art may be used.

Next, also shown in FIG. 12, is the deposition of a conformal metal liner 1200 that is deposited over the entire structure, including on the sidewalk of the MEMS trenches 902, on the cantilever 904, as well as over the passivation layer 700 and within the LMI trench 802. The conformal metal liner 1200 may consist of a metal such as copper, aluminum, copper aluminum alloy, as well as other metals and alloys. The conformal metal liner 1200 may be deposited using and ALD or CVD process.

The deposition of the conformal metal liner 1200 results in the formation of two pairs of parallel metal plates, a first pair of parallel plates 1202 that are fixed and a second pair of parallel plates 1204 that are on the cantilever 904 and are therefore moveable. These two pairs of parallel metal plates are used to enable electromechanical actuation of the cantilever 904. Thus, the MEMS device 900 is fully formed. It should be noted that the MEMS device described herein is just one example of a MEMS device that may be formed on the backside 106 of the semiconductor substrate 100. In alternate implementations, the MEMS device may take on other shapes and/or structures than what is described herein and need not necessarily include a cantilever or two pairs of parallel metal plates. The particular MEMS device shown this specification is just one example of a MEMS device and is provided to help illustrate implementations of the invention.

Although not shown, in various implementations of the invention, the MEMS device 900 is electrically coupled to the redistribution layer 600. The MEMS device 900 can therefore be electrically coupled to the device layer 102 by way of the redistribution layer 600 and the TSV 400. In implementations of the invention, the substrate 100 includes a plurality of TSVs 400, some of which are used to couple the device layer 102 to MEMS devices 900 while other TSVs 400 are used for other purposes.

Figure 14:
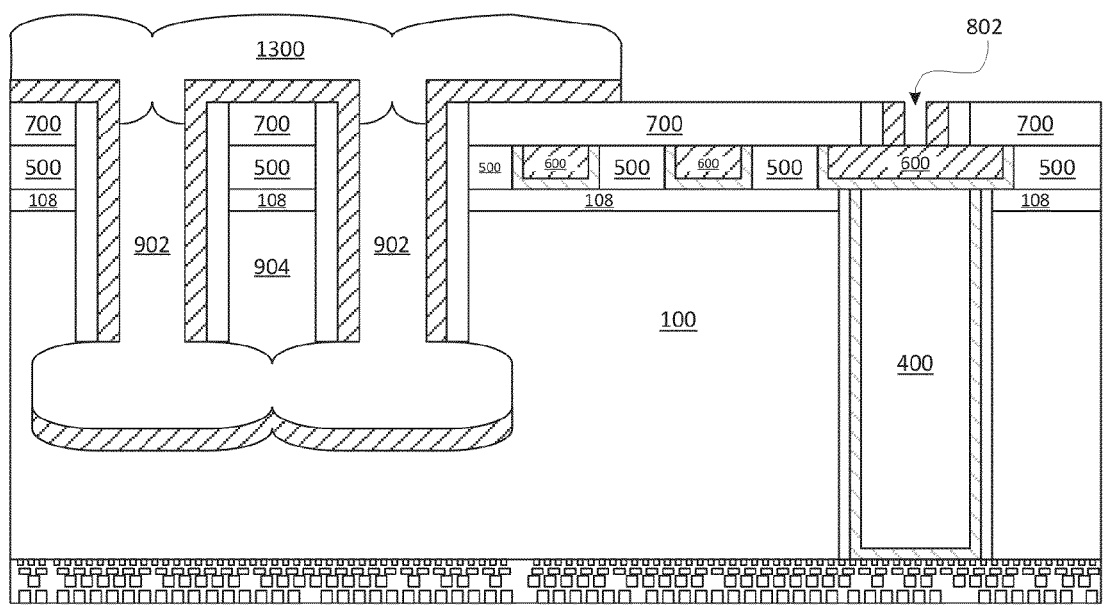

Next, a sealing layer 1300 is formed over the entire structure, including over the MEMS device 900 and the LMI trench 802. The sealing layer 1300 may be formed using an oxide that is deposited using a physical vapor deposition process or a plasma enhanced CVD (PECVD) process. With the scaling layer 1300 in place, as shown in FIG. 14, a portion of the scaling layer 1300 may then be removed using conventional patterning processes to expose the LMI trench 802. Next, the exposed conformal metal liner 1200 may be etched using an anisotropic etching process to remove the conformal metal liner 1200 from atop the passivation layer 700 and from the bottom of the LMI trench 802. The conformal metal liner 1200 remains on the sidewalls of the LMI trench 802.

Figure 15:
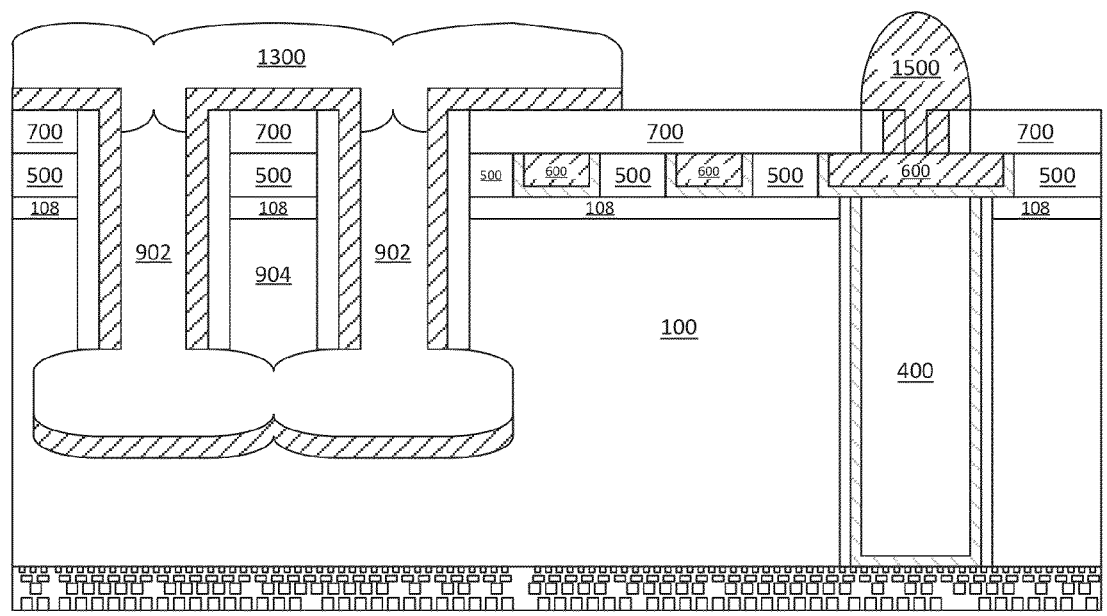

Turning to FIG. 15, the formation of an LMI bump 1500 is shown. The LMI bump 1500 may be formed using metals such as copper, aluminum, tungsten, alloys of these metals, or alternate metals. Conventional deposition processes, including electroplating and electroless plating, may be used to form the LMI bump 1500. In implementations of the invention, the substrate 100 includes a plurality of TSVs 400, some of which are used to couple the device layer 102 to the EMI bumps 1500 while other TSVs 400 are used for other purposes, such as coupling the device layer 102 to MEMS devices 900.

Figure 16:
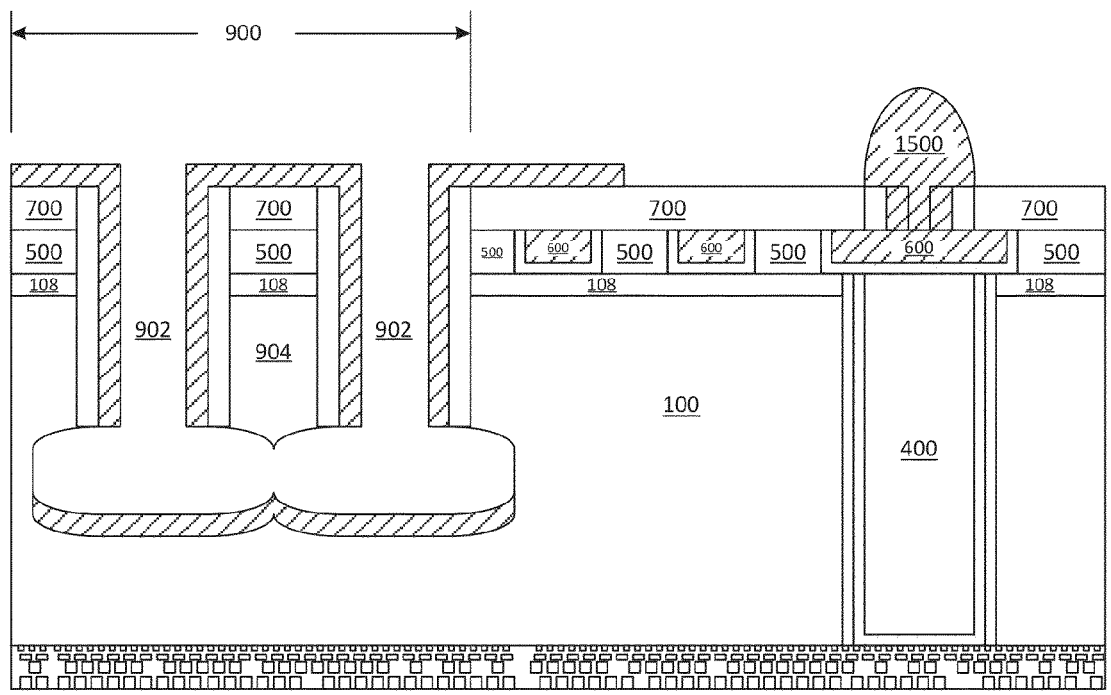

FIG. 16 shows removal of the sealing layer 1300 once the LMI bump is formed. A dry etch process may be used to remove the sealing layer 1300.

Figure 17A:
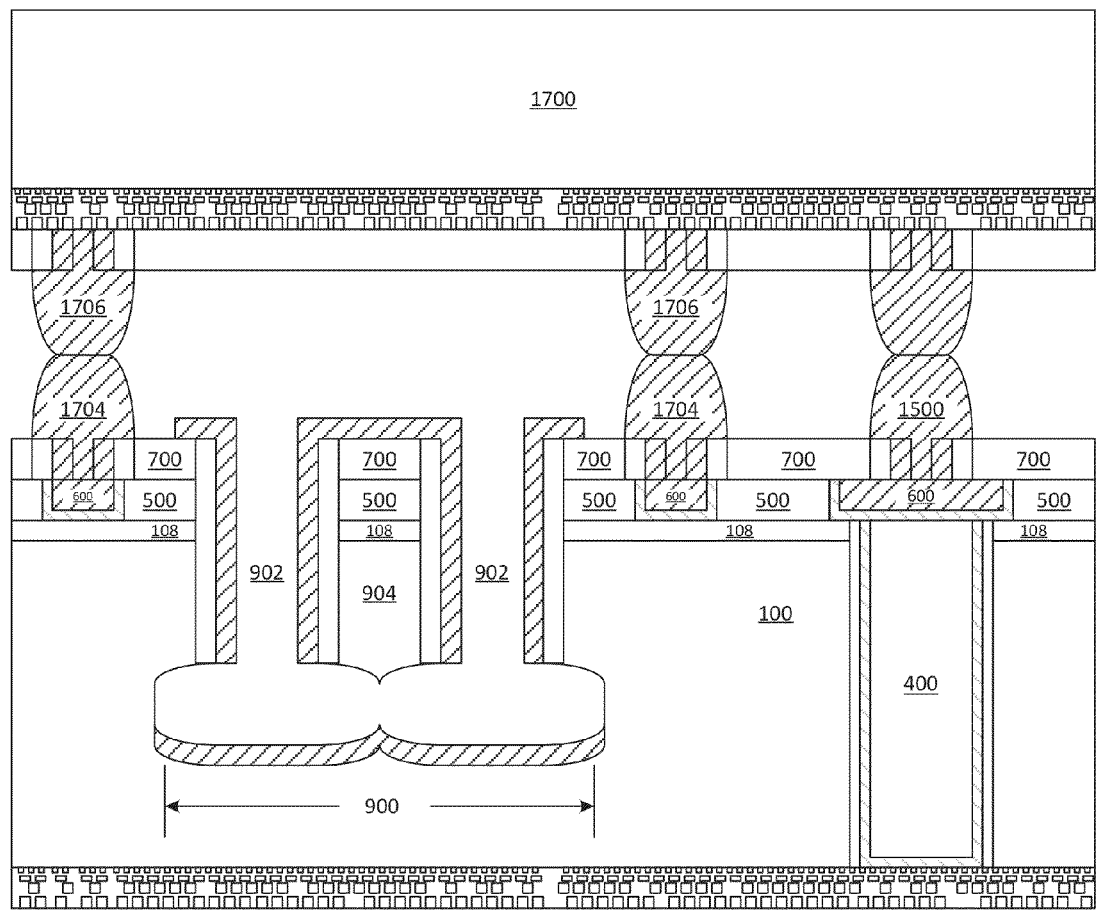
FIGS. 17A and 17B illustrate the integrated circuit die of the invention being coupled to various other devices.
Figure 17B:
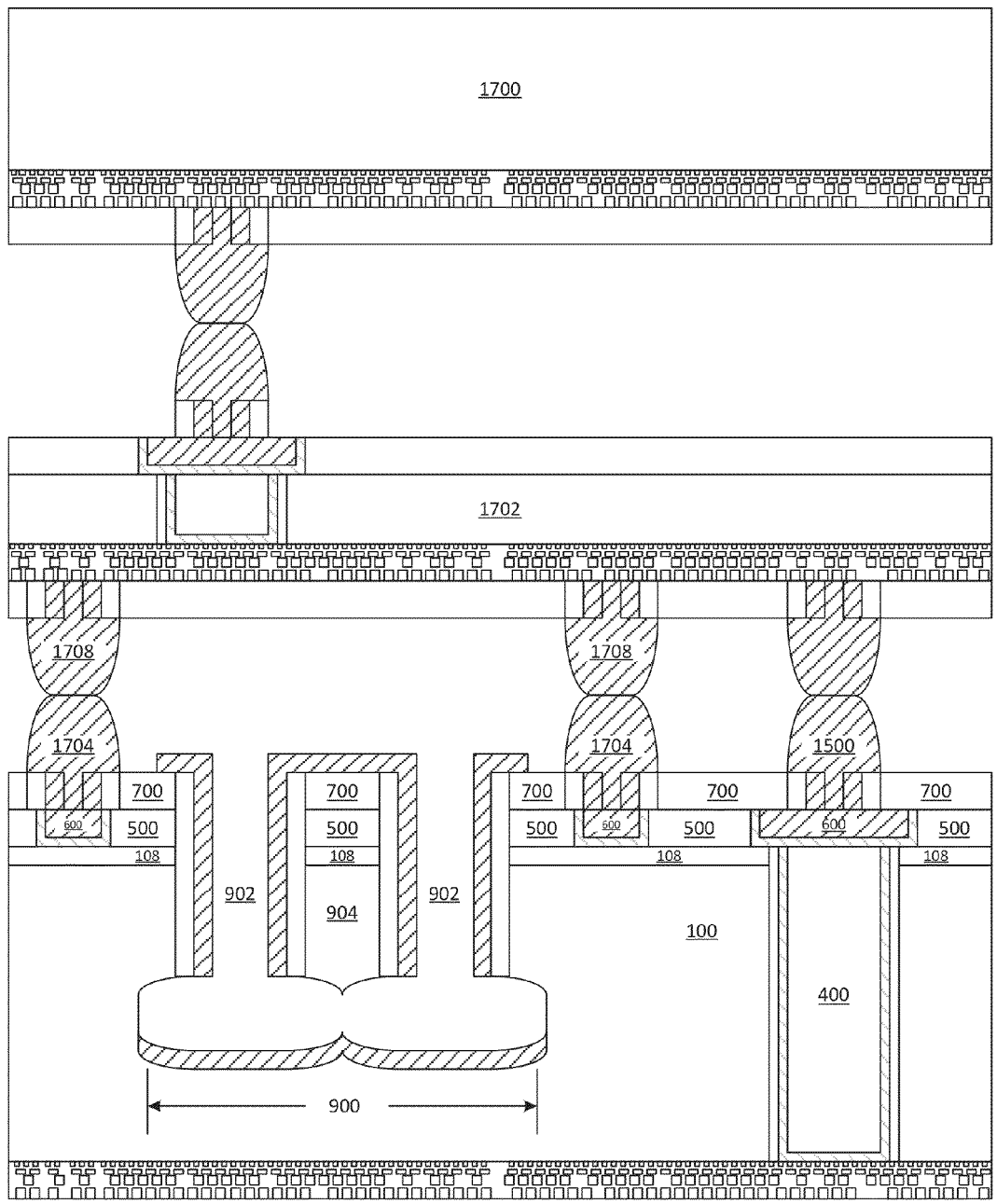

FIGS. 17A and 17B illustrate the semiconductor substrate 100 of the invention being used in SOC applications. In FIG. 17A, the semiconductor substrate 100 having at least one TSV 400 and at least one MEMS device 900 is shown bonded to a memory module 1700. And in FIG. 17B, the semiconductor substrate 100 having at least one TSV 400 and at least one MEMS device 900 is shown bonded to both a memory module 1700 as well as an interposing digital die 1702.

In an implementation of the invention, the MEMS device 900 may be sealed using a sealing EMI structure that surrounds the perimeter of the MEMS device 900. This sealing structure may align with and bond to a corresponding sealing LMI structure located on the second substrate that is being bonded to the substrate 100, such as the memory module 1700 or the digital die 1702. The resulting solder joint between the LMI structure on the substrate 100 and the corresponding LMI structure on the second substrate provides a seal that prevents foreign material, such as underfill material used during packaging of the integrated circuit SOC device, from filling in free spaces or voids in the MEMS device 900 that are necessary for its functionality.

For instance, as shown in FIG. 17A, an LMI structure 1704 is shown that surrounds the MEMS device 900. It should be noted that FIG. 17A is a cross-section so only two portions of LMI structure 1704 are visible, however, it is understood that LMI structure 1704 may surround the entire perimeter of the MEMS device 900. The LMI structure 1704 bonds to a corresponding LMI structure 1706 located on the memory module 1700. In FIG. 17B, the LMI structure 1704 is shown bonded to a corresponding LMI structure 1708 located on the digital die 1702. Again, it should be noted that a variety of different substrates may be coupled to the substrate 100 using LMI structures or LMI-type structures (e.g., C4 bumps), and therefore a variety of different sealing structures may be used to seal the MEMS device 900. Alternately, in lieu of an LMI structure 1704, a solder ring or other sealing structure may be used that surrounds the perimeter of the MEMS device 900 and bonds to a corresponding structure on any substrate being bonded to the substrate 100.

Figure 18:
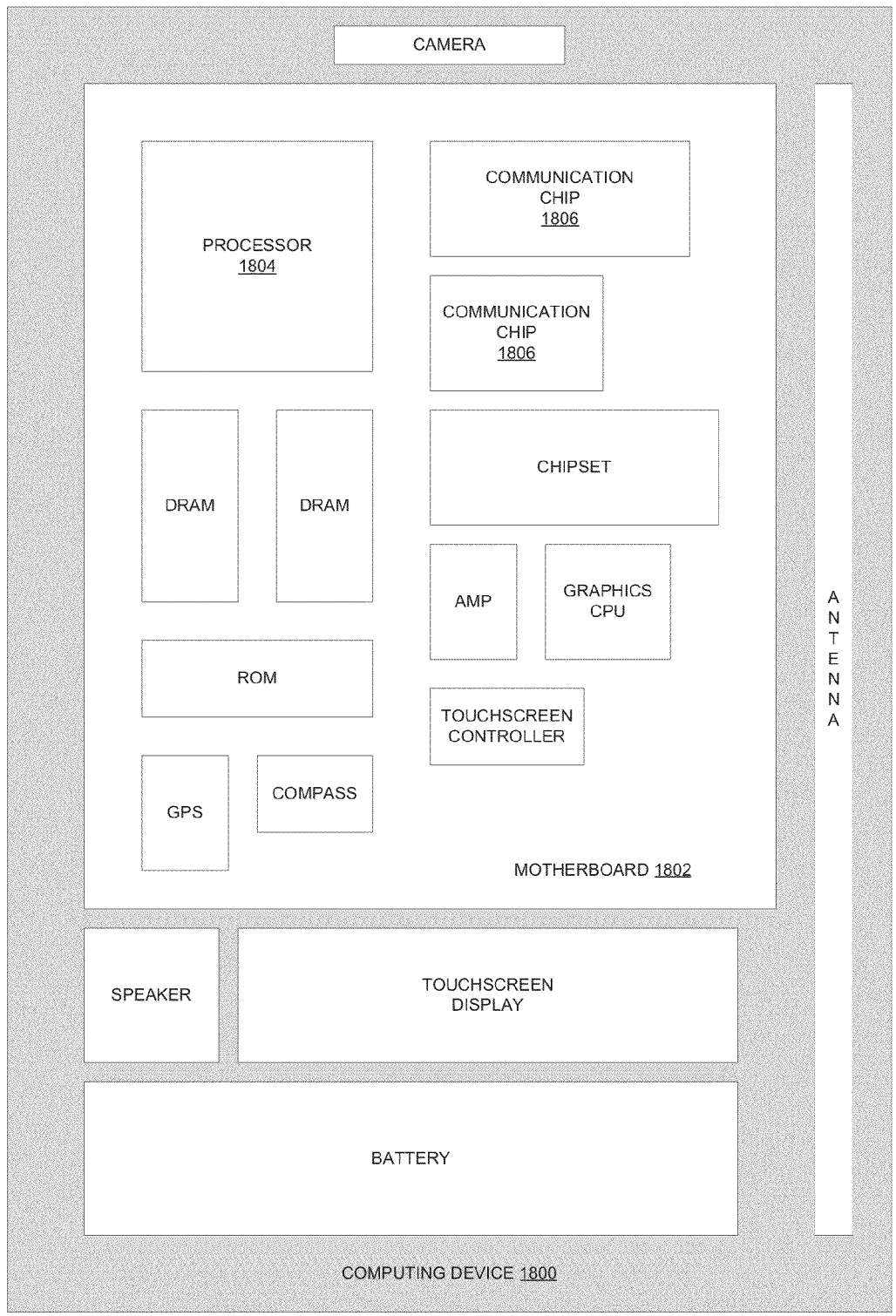
FIG. 18 is a computing device built in accordance with an implementation of the invention.

FIG. 18 illustrates a computing device 1800 in accordance with one implementation of the invention. The computing device 1800 houses a board 1802. The board 1802 may include a number of components, including but not limited to a processor 1804 and at least one communication chip 1806. The processor 1804 is physically and electrically coupled to the board 1802. In some implementations the at least one communication chip 1806 is also physically and electrically coupled to the board 1802. In further implementations, the communication chip 1806 is integrated within the processor 1804.

Depending on its applications, computing device 1800 may include other components that may or may not be physically and electrically coupled to the board 1802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1806 enables wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1800 may include a plurality of communication chips 1806. For instance, a first communication chip 1806 may be dedicated to shorter range wireless communications such as and Bluetooth and a second communication chip 1806 may be dedicated to longer range wireless communications such as GPS, EDGE, GPRS, CDMA, WiMAX, LTE, Ev-DO, and others.

The processor 1804 of the computing device 1800 includes an integrated circuit die packaged within the processor 1804. In some implementations of the invention, the integrated circuit die of the processor includes one or more devices formed on its backside, such as TSVs and backside MEMS devices that are formed in accordance with implementations of the invention. The term "processor" may refer to any device or portion of a device that processes electronic data from registers and/or memory to transform that electronic data into other electronic data that may be stored in registers and/or memory.

The communication chip 1806 also includes an integrated circuit die packaged within the communication chip 1806. In accordance with another implementation of the invention, the integrated circuit die of the communication chip includes one or more devices formed on its backside, such as TSVs and backside MEMS devices that are formed in accordance with implementations of the invention.

In further implementations, another component housed within the computing device 1800 contain an integrated circuit die that includes one or more devices formed on its backside, such as TSVs and backside MEMS devices that are formed in accordance with implementations of the invention.

In various implementations, the computing device 1800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1800 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What we claim is:

1. An apparatus comprising:
   a single semiconductor substrate having a frontside and a backside;
   a through-silicon via (TSV) formed within the semiconductor substrate that extends from the frontside of the substrate to the backside of the substrate; and
   a MEMS device at least partially within the substrate and on the backside of the substrate, the MEMS device electrically coupled to the TSV via a conductor, wherein the conductor is on the backside of the substrate.

2. The apparatus of claim 1, further comprising a device layer fabricated on the frontside of the semiconductor substrate.

3. The apparatus of claim 2, wherein the device layer comprises a transistor and a metal interconnect, and wherein a first end of the TSV is coupled to at least one of the transistor and the metal interconnect.

4. The apparatus of claim 3, wherein the MEMS device is electrically coupled to a second end of the TSV.

5. The apparatus of claim 1, further comprising a logic-memory interface (LMI) connection formed on the backside of the semiconductor substrate.

6. The apparatus of claim 5, wherein the LMI connection is electrically coupled to the TSV.

7. The apparatus of claim 5, further comprising a redistribution layer that includes the conductor.

8. The apparatus of claim 7, wherein the LMI connection is electrically coupled to the TSV by way of the redistribution layer.

9. The apparatus of claim 1, wherein the MEMS device comprises a moveable cantilever, a first set of parallel metal plates that are formed on the moveable cantilever, and a second set of parallel metal plates that are affixed to the semiconductor substrate.

10. The apparatus of claim 1, wherein the MEMS device comprises a sensor, a microsensor, a resonator, an actuator, a microactuator, or a transducer.

11. An apparatus comprising:
    a single semiconductor substrate;
    a device layer formed on a frontside of the single semiconductor substrate;
    a redistribution layer formed on a backside of the single semiconductor substrate;
    a through silicon via (TSV) formed within the single semiconductor substrate that is electrically coupled to the device layer and to the redistribution layer;
    a logic-memory interface (LMI) formed on a backside of the single semiconductor substrate that is electrically coupled to the redistribution layer; and
    a MEMS device formed on the backside of the single semiconductor substrate that is electrically coupled to the redistribution layer.

12. The apparatus of claim 11, wherein the redistribution layer couples the TSV to the LMI or the MEMS device.

13. The apparatus of claim 11, further comprising a sealing LMI that surrounds a perimeter of the MEMS device.

14. The apparatus of claim 13, wherein the sealing LMI comprises a solder ring.

15. An apparatus comprising:
a first substrate having a frontside and a backside;
a device layer fabricated on the frontside of the first substrate;
a redistribution layer fabricated on the backside of the first substrate;
a through-silicon via (TSV) formed through the first substrate, wherein a first end of the TSV is electrically coupled to at least a transistor or at least a metal interconnect of the device layer and a second end of the TSV is electrically coupled to the redistribution layer;
a first logic-memory interface (LMI) bump fabricated on the backside of the first substrate, wherein the first LMI bump is electrically coupled to the redistribution layer;
a MEMS device fabricated on the backside of the first substrate, wherein the MEMS device is electrically coupled to the redistribution layer; and
a memory module substrate having a second LMI bump, wherein the second LMI bump is electrically coupled to the first LMI bump of the first substrate.

16. The apparatus of claim 15, further comprising an interposer substrate sandwiched between the first substrate and the memory module substrate, wherein a third LMI bump is formed on a frontside of the interposer substrate and is electrically coupled to the first LMI bump of the first substrate, and wherein a fourth LMI bump is formed on a backside of the interposer substrate and is electrically coupled to the second LMI bump of the memory module substrate.

17. The apparatus of claim 16, wherein the interposer substrate includes a digital die.

18. The apparatus of claim 16, further comprising:
a first sealing LMI structure fabricated on the first substrate that surrounds a perimeter of the MEMS device; and
a second sealing LMI structure fabricated on the interposer substrate that is bonded to the first sealing LMI structure, thereby forming a seal around the MEMS device.

19. The apparatus of claim 15, wherein the MEMS device is electrically coupled to the device layer through the redistribution layer and the TSV.

20. The apparatus of claim 15, wherein the LMI bump is electrically coupled to the device layer through the redistribution layer and the TSV.

21. The apparatus of claim 15, further comprising:
a first sealing LMI structure fabricated on the first substrate that surrounds a perimeter of the MEMS device; and
a second sealing LMI structure fabricated on the memory module substrate that is bonded to the first sealing LMI structure, thereby forming a seal around the MEMS device.

22. A wireless device comprising:
an antenna;
a display;
a battery;
at least one communications chip; and
an SOC integrated circuit processor comprising:
a first substrate having a frontside and a backside;
a device layer fabricated on the frontside of the first substrate;
a redistribution layer fabricated on the backside of the first substrate;
a through-silicon via (TSV) formed through the first substrate, wherein a first end of the TSV is electrically coupled to at least a transistor or at least a metal interconnect of the device layer and a second end of the TSV is electrically coupled to the redistribution layer;
a first logic-memory interface (LMI) bump fabricated on the backside of the first substrate, wherein the first LMI bump is electrically coupled to the redistribution layer;
a MEMS device fabricated on the backside of the first substrate, wherein the MEMS device is electrically coupled to the redistribution layer; and
a second substrate having a memory module and a second LMI bump, wherein the second LMI bump is electrically coupled to the first LMI bump of the first substrate.

23. The device of claim 22, further comprising at least one of a graphics processor, a touchscreen display, and a GPS chip.

24. The device of claim 22, further comprising an interposer substrate sandwiched between the first substrate and the second substrate, wherein a third LMI bump is formed on a frontside of the interposer substrate and is electrically coupled to the first LMI bump of the first substrate, and wherein a fourth LMI bump is formed on a backside of the interposer substrate and is electrically coupled to the second LMI bump of the second substrate.

25. The device of claim 22, wherein at least one of the MEMS device and the first LMI bump is electrically coupled to the device layer through the redistribution layer and the TSV.

\* \* \* \* \*